United States Patent [19]
Pease

[11] Patent Number: 5,190,241
[45] Date of Patent: * Mar. 2, 1993

[54] AVIONIC TRAY AND METHOD OF MAKING SAME

[75] Inventor: Raymond J. Pease, Sherborne, England

[73] Assignee: Hollingsead International, Inc., Santa Fe Springs, Calif.

[*] Notice: The portion of the term of this patent subsequent to Jul. 14, 2009 has been disclaimed.

[21] Appl. No.: 863,842

[22] Filed: Apr. 6, 1992

Related U.S. Application Data

[63] Continuation-in-part of Ser. No. 780,280, Oct. 18, 1991, Pat. No. 5,129,594.

[51] Int. Cl.$^5$ .............................................. G12B 9/00
[52] U.S. Cl. .................................... 244/1 R; 361/383; 361/384; 361/427; 248/27.1; 174/52.1; 244/129.1
[58] Field of Search ............... 244/1 R, 129.1, 131; 361/383, 384, 427, 380; 248/27.1; 174/52.1, 52.4, 63

[56] References Cited

U.S. PATENT DOCUMENTS

| | | | |
|---|---|---|---|
| 3,710,476 | 1/1973 | Hollingsead et al. | 248/27.1 X |
| 3,771,023 | 11/1973 | Hollingsead et al. | 361/383 |
| 4,044,515 | 8/1977 | Hollingsead et al. | 361/383 |
| 4,458,296 | 7/1984 | Bryant et al. | 361/383 |
| 4,687,127 | 8/1987 | Pardo et al. | 361/383 |
| 4,766,517 | 8/1988 | Abell | 361/383 |

Primary Examiner—Joseph F. Peters, Jr.
Assistant Examiner—Christopher P. Ellis
Attorney, Agent, or Firm—Harold L. Jackson

[57] ABSTRACT

An avionic tray for supporting an avionic equipment box including a flat bottom section having an opening for communicating with an air plenum chamber and a pair of side rails, of unitary construction with the bottom section, extending upwardly at right angles to and at the lateral edges of the bottom section. A pair of vertically spaced and inwardly projecting back plate support tabs are formed in each side rail, the tabs defining flat surface lying in a plane perpendicular to the bottom section and the side rails. A back plate, having an opening for receiving a connector, is riveted to the support tabs and the bottom section to position the back plate and its associated connector precisely at right angles to the side rails and the bottom section.

17 Claims, 3 Drawing Sheets

AVIONIC TRAY AND METHOD OF MAKING SAME

BACKGROUND OF THE INVENTION

1. Related Application

This application is a continuation-in-part of application ser. no. 780,280 filed on Oct. 18, 1991 now U.S. Pat. No. 5,129,594 entitled Avionic Tray and Method of Making Same.

2. Field of the Invention

The present invention relates to avionic racking trays and more particularly to avionic trays and a method of manufacturing such trays in which the electrical connector carried by the tray is accurately positioned for mating contact with the connector carried by the avionic equipment supported on the tray.

3. Description of the Prior Art

Avionic racking trays have been known in the art for a long time. More particularly, in accordance with the usual practice in the aircraft building industry, each piece of electronic equipment used in an aircraft is contained in a separate container which is supported by an individual tray. The trays are, in turn, mounted substantially at their respective front and back ends on cross beams provided in the aircraft. The trays are usually made in standard ATR (aircraft tray racking) widths to accommodate various sizes of instruments. It is customary to mount the electronic instruments, such as radios, inertial navigation systems, radar systems etc., in rectangular boxes, generally painted black. As a result such avionic instruments are sometimes referred to in the trade and in the ensuing description as "black boxes".

The trays are usually mounted above a plate attached to the cross beams, so that the plate and the bottom sections of the trays and the cross beams jointly form an air plenum chamber. Air is usually continuously evacuated from or forced out of the air plenum chamber to cool the components inside of the black boxes. The trays usually have a depressed central portion into which a separate metering plate, having one or more air metering holes, is mounted, surrounded by a gasket.

The usual avionic racking trays include vertical side rails disposed at the lateral edges of a substantially horizontally disposed base plate or bottom of the tray. A back plate is mounted with fasteners (such as bolts and nuts) between the side rails. The back plate has one or more openings or cut-out portions into which one or more female (half) electrical connectors are mounted Such connector halves contain a multitude of female receptacles which receive male electrical connector pins extending outwardly from the male connector half carried by the electronic equipment.

The back plate must be disposed precisely at a right angle relative to the base plate or bottom of the tray in order to enable the male pins of the electronic equipment to engage matching female receptacles in the electric connector half mounted to the back plate. Attaching the back plate to the side rails by ordinary nuts and bolts, however, does not provide sufficient precision for this purpose. As is described in detail in U S. Pat. No. 3,710,476 this problem has been solved in the prior art by providing jig pins in the interior side of the side rails. The back plate is then provided with holes to register with the jig pins to provide a self-aligning assembly, which is fastened together by bolts and nuts, or other like fastener means.

The solution to the back plate alignment problem afforded by the '047 patent requires complex manufacturing operations resulting in an expensive tray. In particular, the formation of the jig pins on the side rails requires the use of accurately controlled punches and dies to half shear the pressed metal which become the jig pins. In addition, this operation requires that the back plate have lateral sides or flanges which adds to the overall weight and cost of the tray.

There are significant advantages to be gained in the art by reducing the complexity of the manufacturing operations and structure necessary to produce a tray in which the back plate is precisely aligned with respect to the tray bottom and side rails. The present invention accomplishes this task while providing a less expensive tray with improved back plate alignment.

SUMMARY OF THE INVENTION

In accordance with the method of the present invention a flat metal sheet stock, preferably made of aluminum, is sheared to an outline of the bottom section and side rails of the tray. The sheared sheet is bent along two longitudinal lines coincident with the lateral edges of the bottom section to form side rails extending upwardly and at right angles to the bottom section. At least one cut is made in each side rail adjacent the rear end thereof Each of the side rails are bent inwardly commencing at the ends of the cuts along straight lines lying in a plane perpendicular to the bottom section and the side rails to form tabs extending at right angles to the side rails for aligning and supporting the back plate.

An outline of the back plate is also sheared from the sheet metal stock and provided with one or more connector openings therein. Preferably the back plate sheet is bent to form rearwardly extending flanges at the top and bottom thereof to provide additional strength. The back plate is positioned against the tabs and secured thereto by suitable means such as rivets. The resulting avionic tray comprises the apparatus aspect of the present invention.

The features, which are believed to be novel, are set forth with particularity in the appended claims. The present invention, both as to its organization and manner of operation, together with further objects and advantages thereof, may best be understood by reference to the following description taken in conjunction with the accompanying drawings.

DESCRIPTION OF THE PREFERRED EMBODIMENT

Figure 3:
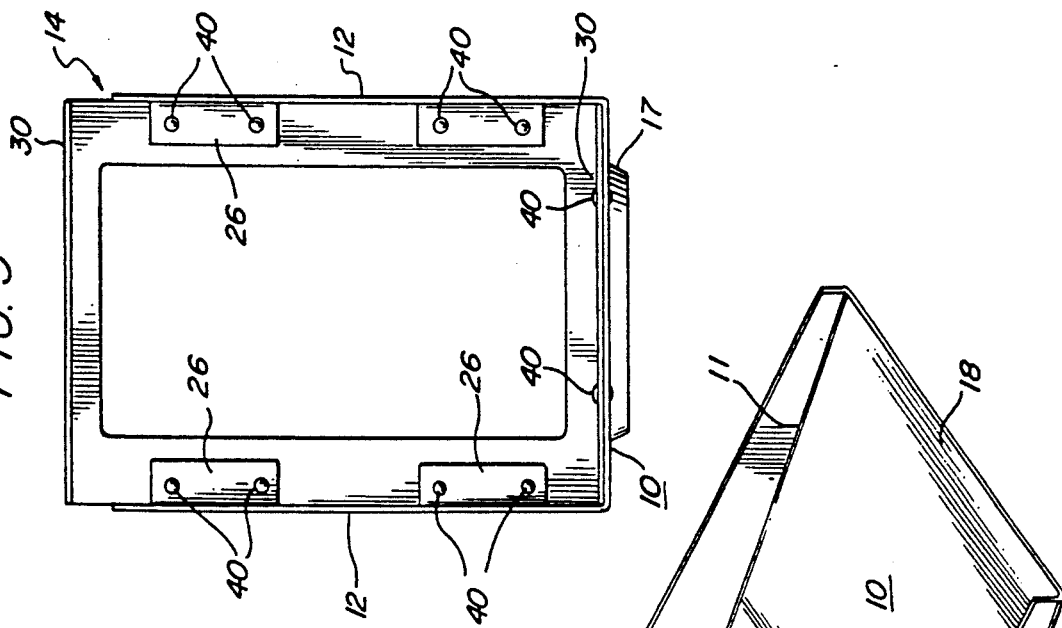
FIG. 3 is a back elevational view of the tray in assembled form.
Figure 1:
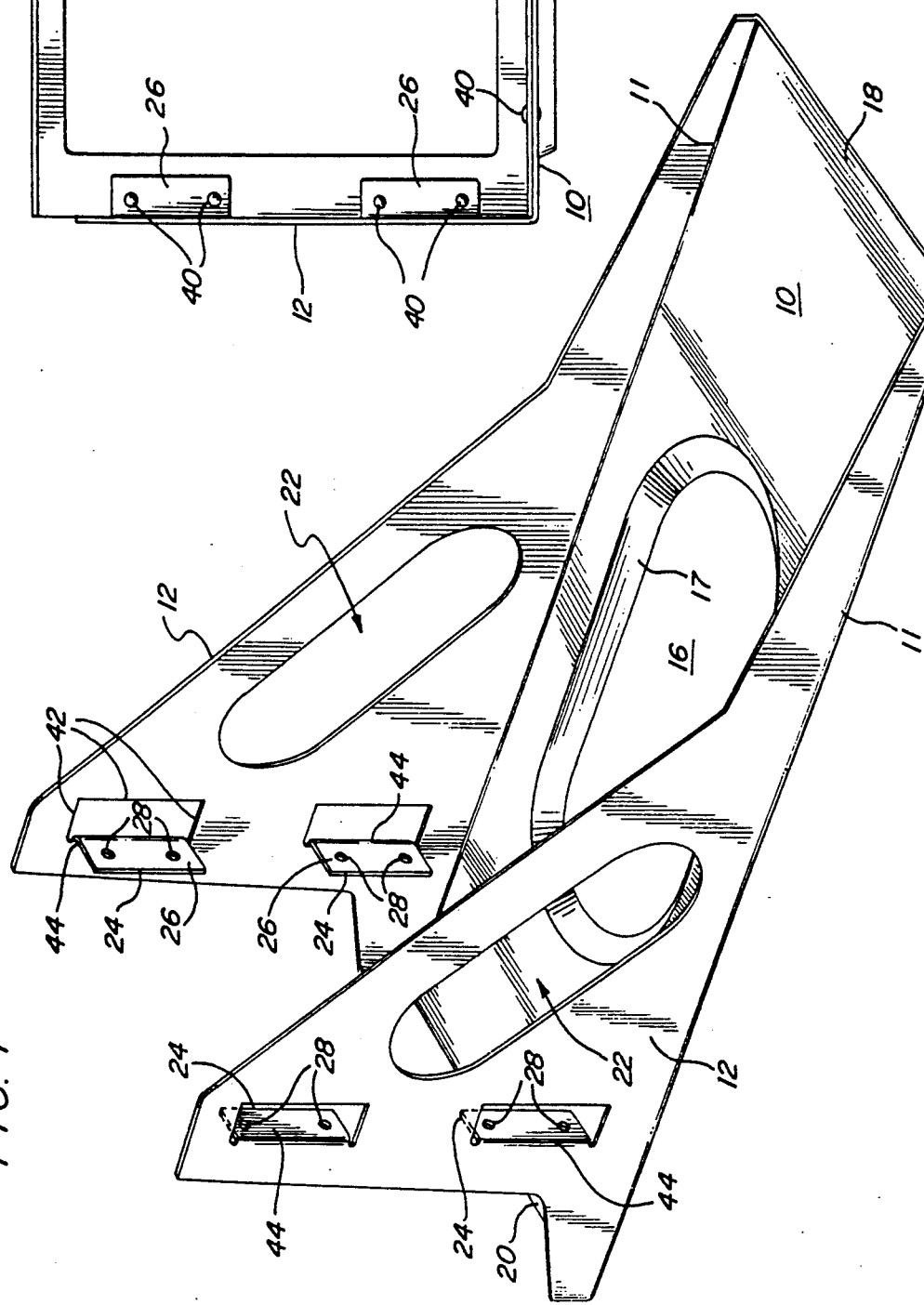
FIG. 1 is a perspective view of bottom and side rail portion of an avionic tray in accordance with the present invention.
Figure 2:
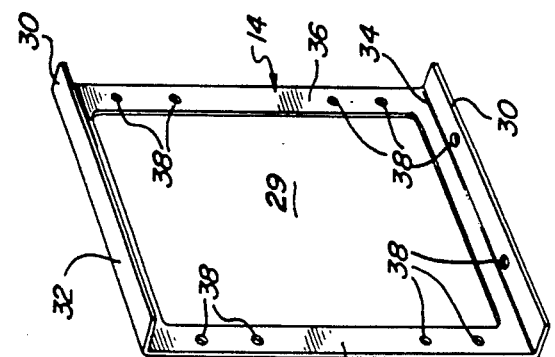
FIG. 2 is a perspective view of the back plate portion of a tray in accordance with the invention.

Referring now to the drawings and particularly to FIGS. 1-3, the tray includes a generally rectangular base or bottom section 10 and a pair of side rails or uprights 12 extending upwardly at the lateral edges 11 of the bottom surface. The side rails support a back plate 14 as will be explained in more detail. The bottom section 10 includes an oval shaped opening 16 intermediate the front (18) and rear (20) end of the tray for communication with a plenum chamber to be described in conjunction with FIG. 4. A downwardly extending flange 17 with a straight wall extends around the opening 16 for holding a gasket and metering plate in place on the tray bottom 10. A preferred flange arrangement in which the side wall intersects the bottom section of the tray at an angle of about 45° is described in my copending application Ser. No. 07/752,039, filed Aug. 29, 1991, and assigned to the assignee of this application.

The side rails 12 have weight reducing openings 22 therein and inwardly projecting back plate alignment tabs 24. The tabs 24 are preferably rectangular in shape and define substantially flat surfaces 26 lying in a plane perpendicular to the bottom section 10 and the side rails 12. Holes 28 are punched or drilled in the tabs 24 and in the bottom section 10 to receive rivets for mounting the back plate 14 thereon.

The back plate 14 has an opening 29 therein for receiving one half of an electrical connector. Flanges 30 extend rearwardly from the upper (32) and lower (34) edges of the central portion 36 of the back plate 14 and at right angles thereto for increasing the modulus and strength of the back plate. Rivet holes 38 are provided in the central side and bottom portions of the back plate 14 as shown. The back plate is mounted to the side rail tabs 24 and the bottom section 10 by rivets 40 as is shown in FIG. 3.

To manufacture the tray of FIGS. 1-3, a sheet of metal, preferably 0.063" thick of aircraft quality, e.g. 6061-T6, is sheared to an outline of the bottom section 10 and side rails 12 in one plane. The plenum chamber opening 16 and weight reducing openings 22 may also be made during this or a subsequent shearing operation. The outline for the back plate alignment and support tabs 24 may also be made during this shearing operation by making a pair of generally U-shaped cuts 42 in each of the side rails so that the straight lines 44, extending between the ends of the cuts, lie in a plane perpendicular to the lateral edges 11 of the bottom section 10.

The side rails 12 are formed by bending the sheared sheet along longitudinal lines coincident with the lateral edges 11 until the side rails extend at right angles to the bottom section 10. The rectangular portions of the side rails outlined on three sides by the cuts 42 are then bent inwardly at right angles along the lines 44 to form the tabs 24. If desired, the cuts 44 may be made after the side rails are formed in their finished position.

The back plate 14 is formed by shearing metal sheet stock (such as that used to form the bottom section and side rails) to provide an outline of the back plate with the connector opening therein. The flanges 30 are formed by a simple bending operation.

Figure 4:
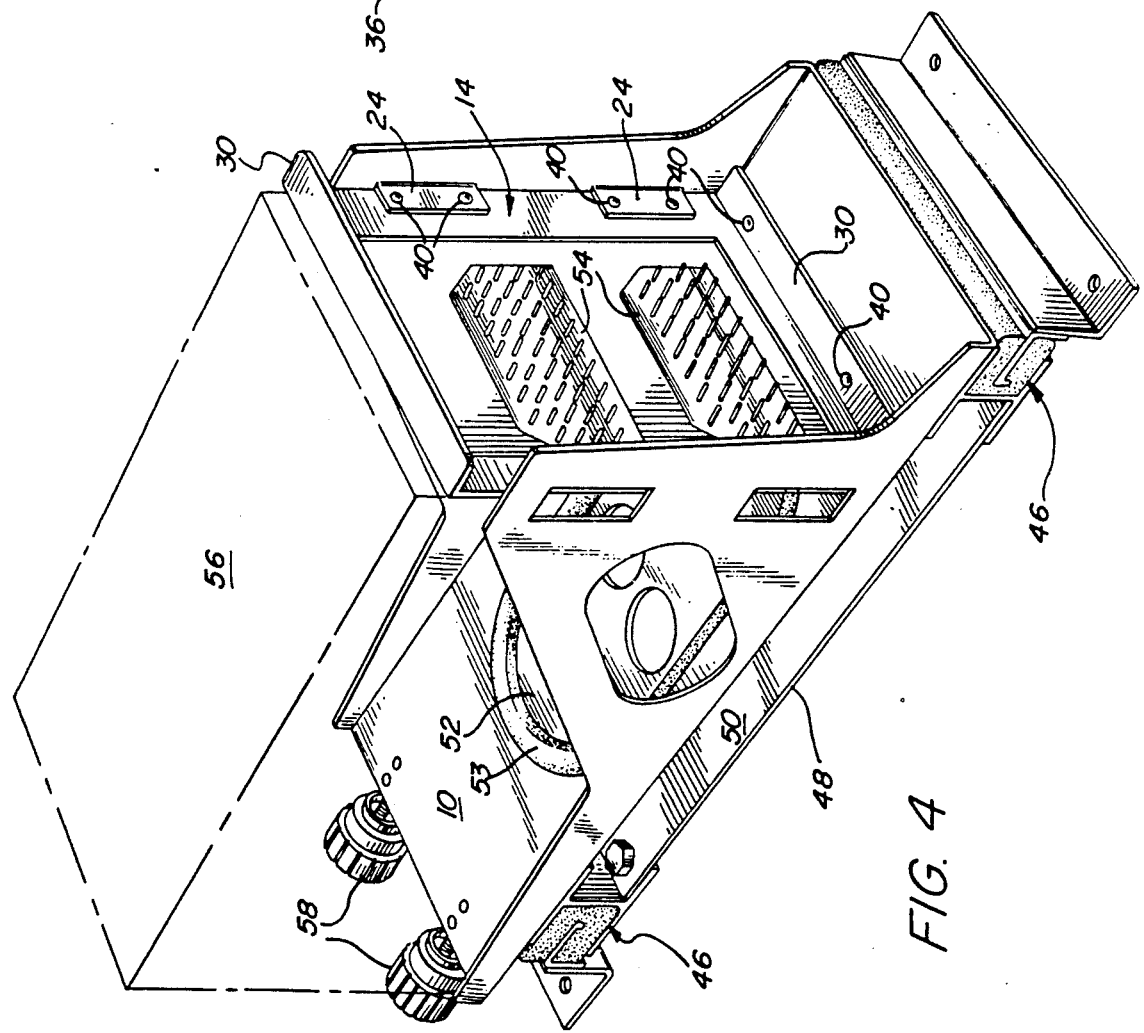
FIG. 4 is a perspective view of the assembled tray mounted on a pair of cross beams with a metering plate installed in bottom section and a connector half (female) secured to the back plate and an electronic instrument "shown in phantom lines" supported by the tray.

FIG. 4 illustrates the assembled tray mounted on a pair of cross beams 46 with a plate 48 extending between the bottom of the beams to form an air plenum chamber 50 with the bottom surface of the tray in a conventional manner. An apertured metering plate 52 is mounted within the plenum chamber opening 16 by a gasket 53. One such metering plate and gasket arrangement described in my co-pending application referenced above. A half (female) connector 54 is mounted on the back plate 14 for mating with a complementary half (male) connector (not shown) carried at the back of the black box 56 (shown in phantom lines) supported on the tray. A pair of conventional inserter/extractor units 58, such as those described in U.S. Pat. No. Re. 33,283, are mounted on the front of the tray bottom section for inserting and extracting the box 56 with respect to the tray.

Figure 6:
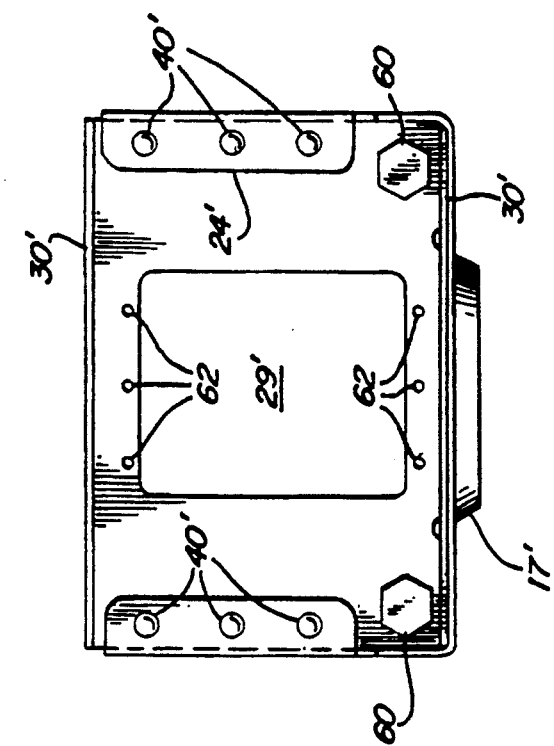
FIG. 6 is a back elevational view of the assembled tray of FIG. 5.
Figure 5:
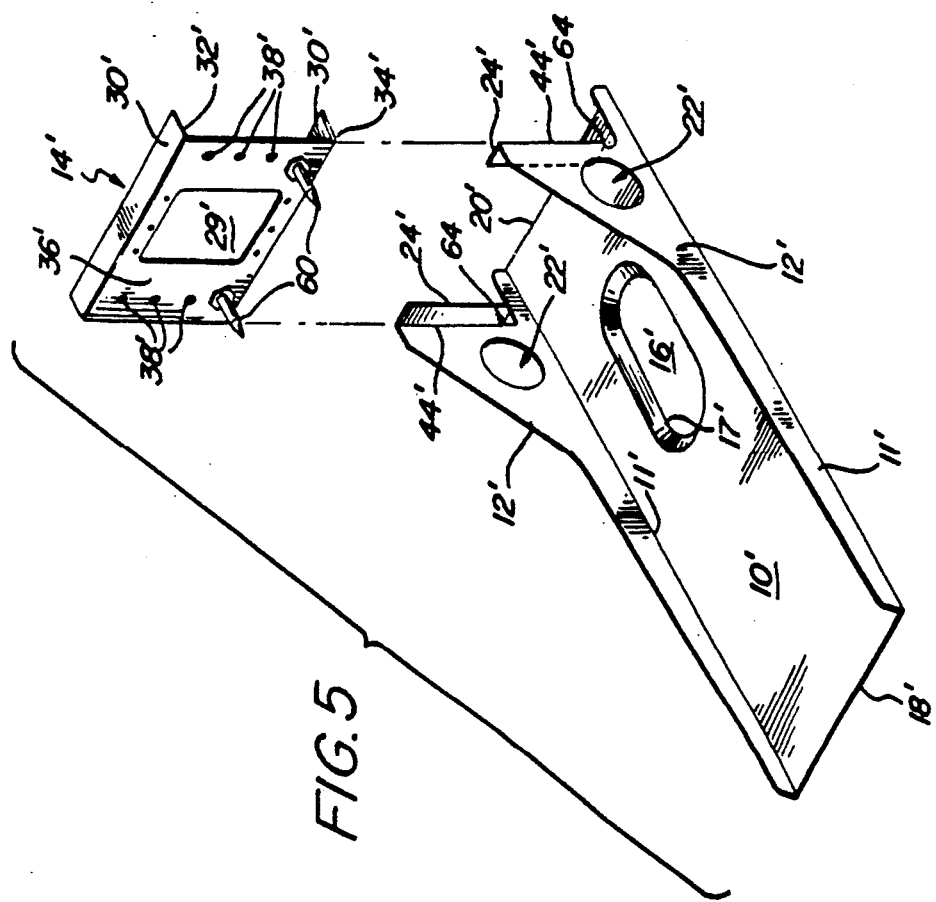
FIG. 5 is a perspective view of another embodiment of the invention with the back plate positioned above the tray for clarity.

The embodiment illustrated in FIGS. 5 and 6 incorporates a single back plate alignment and support tab 24' on each side rail in lieu of the pair of tabs 24 utilized in the embodiment of FIGS. 1-3. The sections of the tray of FIGS. 5 and 6 which correspond to the sections of the tray of FIGS. 1-3 are given the same reference numerals with a prime symbol as illustrated. A pair of dagger pins 60 for mating with a pair of conventional registering apertures on the instrument housing (not shown) are carried by the back plate 14'. Rivet holes 62 are also provided in the back plate 14' for receiving mounting rivets for an electrical connector (not shown).

To manufacture the tray of FIGS. 5 and 6, a sheet of metal such as 6061 T4 aluminum is sheared or cut to an outline of the bottom section 10' and side rails 12' in one plane. The plenum chamber opening and weight reducing openings 22' may also be made during this operation. It should be noted that the outline for the alignment tabs 24' are also preferably made at this time. The outlines include a cut 64 at the rear end of each side rail and adjacent the bottom section 10'. The cuts 64 are preferably parallel to the lateral edges 11' as shown. As in the earlier described embodiment, the side rails 12' are formed by bending the sheared sheet along longitudinal lines coincident with the lateral edges 11' until the side rails extend at right angles to the bottom section 10'. The portions of the side rails for forming the alignment tabs 24' are then bent inwardly at right angles along straight lines 44' commencing at the ends of cuts 64. The lines 44' lie in a plane perpendicular to the lateral edges 11' of the bottom section 10' and form the back edges of the upper portions of the upstanding side rails as shown.

The back plate 14' is formed in the same manner as the plate 14 of FIGS. 1-3. The back plate is mounted to the alignment tabs 24' and the bottom 10' by means of rivets 40'.

There has been described a novel avionic tray which is simple and inexpensive to manufacture and provides a precise alignment of the back plate and the connector half mounted thereon with respect to the bottom and side rails. Various modifications of the tray will become apparent to those skilled in the art in light of the foregoing disclosure without involving any departure from the spirit and scope of the invention.

What is claimed is:

1. A generally elongated avionic tray having a front and rear end for supporting an avionic black box above a plenum chamber and for holding one half of an electrical connector arranged to mate with a complementary other half connector carried at the back of the box comprising:
   a substantially flat bottom section of unitary construction of metal sheet and defining an opening intermediate the front and rear ends of the tray adapted to communicate with the plenum chamber;

a pair of side rails of unitary construction with the bottom section and extending upwardly at lateral edges of the bottom section and at right angles thereto;

at least one inwardly projecting back plate support and alignment tab formed in each side rail, the tabs defining substantially flat surfaces lying in a plane perpendicular to the bottom section and the side rails, said flat tab surfaces being positioned at the rear end of the side rails for accommodating the black box between the tabs and the front end of the tray; and a back plate having an opening for receiving the said half connector, the back plate being secured to the alignment tabs so that the connector half is positioned precisely at right angles with respect to the bottom surface and the side rails to insure proper mating between both halves of the connector when the black box is mounted on the tray.

2. The avionic tray of claim 1 wherein said at least one alignment tab in each side rail comprises one tab.

3. The avionic tray of claim 2 wherein the tabs are substantially rectangular.

4. The avionic tray of claim 3 wherein the back plate comprises a substantially flat aluminum sheet with a pair of flanges extending rearwardly from the top and bottom edges of the plate and at right angles thereto.

5. The avionic tray of claim 4 wherein the back plate is secured to the front of the tabs.

6. The avionic tray of claim 5 wherein the back plate is rivited to the tabs.

7. A method of making an avionic tray for supporting an avionic black box above a plenum chamber and holding one-half of an electrical connector arranged to mate with a complementary half connector mounted on the back of the box, the tray having a flat bottom section with lateral edges, a front and rear end, a pair of side rails and a back plate having upper and lower ends comprising the steps of:

a) shearing an aluminum alloy sheet to provide a predetermined outline encompassing the desired dimensions of the bottom section and a pair of side rails with a plenum chamber opening intermediate the ends of the bottom section and with a cut in each of the side rails adjacent the rear end thereof;

b) bending the sheared sheet along two longitudinal lines coincident with the lateral edges of the bottom section to form the side rails at right angles to the bottom section;

c) further bending each side rail inwardly commencing at the end of the cut therein and extending along a straight line lying in a plane perpendicular to the lateral edges of the bottom section to form back plate support and alignment tabs extending in a plane perpendicular to the planes of the side rails and bottom section;

d) shearing an aluminum alloy sheet to provide a predetermined outline encompassing the desired dimensions of the back plate with an electrical connector opening therein; and e) securing the back plate to the tabs.

8. The method of claim 7 wherein the cut in each side rail extends along a line generally parallel to the lateral edges of the bottom section.

9. The method of claim 8 wherein the cut in each side rail is adjacent the bottom of the respective side rail.

10. The method of claim 9 further including the step of bending the back plate sheet to form flanges at the upper and lower ends thereof, the flanges extending rearwardly and at right angles to the plane of the tabs.

11. The method of claim 10 further including the step of drawing a downwardly extending flange around the plenum chamber opening, the flange having a substantially straight side wall.

12. The method of claim 10 wherein the tabs are generally rectangular in shape.

13. The method of claim 12 wherein the back plate is secured to the tabs and the bottom sections by rivets.

14. The method of claim 13 wherein the the back plate is riveted to the front of the tabs.

15. In a method of making an avionic tray for supporting an avionic black box and holding one-half of an electrical connector arranged to mate with a complementary half connector mounted on the back of the box, the tray having a flat bottom section with lateral edges, a front and rear end, a pair of side rails and a back plate having an upper and lower ends, said back plate being arranged to hold the half connector, the combination of steps comprising:

a) shearing metal sheet stock to an outline of the bottom section and side rails in one plane;

b) bending the sheared sheet along two longitudinal lines coincident with the lateral edges of the bottom section to form the side rails extending upwardly and at right angles to the bottom section;

c) making at least one cut in each of the side rails adjacent the rear end thereof and extending generally parallel to the lateral edges of the bottom section;

d) bending a generally rectangular portion of each of the side rails inwardly commencing at the end of the cut and extending along a straight line perpendicular to the plane of the bottom section so that the bent portions form tabs for aligning and supporting the back plate;

e) shearing metal sheet stock to provide an outline of the back plate and a connector opening therein;

f) bending the sheared back plate sheet to form flanges extending at right angles to the sheet at the upper and lower portions thereof;

g) positioning the back plate against the tabs so that the flanges extend toward the rear end of the tray; and h) securing the back plate to the tabs.

16. The method of claim 15 wherein the metal sheet stock is aluminum.

17. The method of claim 15 wherein the alignment tabs form the rear end of the upper portion of the side rails.

* * * * *